United States Patent [19]

Sado et al.

[11] 4,211,890
[45] Jul. 8, 1980

[54] ELECTRONIC CIRCUIT BOARDS

[75] Inventors: Ryoichi Sado, Saitama; Koichi Nei, Tokyo, both of Japan

[73] Assignee: Shin-Etsu Polymer Co., Ltd., Tokyo, Japan

[21] Appl. No.: 906,742

[22] Filed: May 17, 1978

[30] Foreign Application Priority Data

May 25, 1977 [JP] Japan .............................. 52-67413[U]

[51] Int. Cl.² ............................................... H05K 1/08
[52] U.S. Cl. ............................... 174/68.5; 174/52 FP; 174/138 G; 339/17 F; 361/403
[58] Field of Search ............. 174/68.5, 52 FP, 138 G; 339/17 F, 17 LC, 59 M; 361/403, 398

[56] References Cited

U.S. PATENT DOCUMENTS

| 2,984,697 | 5/1961 | Bontecue | 174/68.5 |
| 2,997,521 | 8/1961 | Dahlgren | 174/68.5 |
| 3,114,587 | 12/1963 | Herrmann | 339/17 F |
| 3,251,927 | 5/1966 | Iovenko | 174/68.5 X |
| 3,971,610 | 7/1976 | Buchoff | 174/68.5 X |
| 4,116,517 | 9/1978 | Selvin | 339/17 F |

Primary Examiner—Richard R. Kucia
Attorney, Agent, or Firm—Hopgood, Calimafde, Kalil, Blaustein & Lieberman

[57] ABSTRACT

An electronic circuit board has protrusions of rubber-like material on the surface opposite to the surface on which the printed circuit is provided with terminal contact points located at positions in correspondence with the individual terminal contact points or with the individual groups of the terminal contact points, each of the groups being composed of the terminal contact points aligned in a row.

1 Claim, 2 Drawing Figures

ELECTRONIC CIRCUIT BOARDS

BACKGROUND OF THE INVENTION

The present invention relates generally to circuit boards for electronic devices and, in particular, to a circuit board with flexibility for electronic devices having a structure capable of giving connections with high reliability.

In recent years, various kinds of circuit boards with flexibility for electronic devices have been developed by providing a printed circuit on the surface of a sheet-like electrically insulating material such as polyimide resin, polyester resin and the like. Such types of circuit boards are widely employed in assembling various kinds of precision electronic devices. When these circuit boards are employed is assembling a precision electronic device, the electric connection between the terminal contact points of the circuit board, arranged in an area usually at the peripheries of the board, and other parts of the device is made in several different ways such as soldering, fastening with bolts and nuts or clamping with a specifically designed jig such as a clip (see, for example, U.S. Pat. No. 3,924,915 and Brit. Pat. No. 940,518).

Among these known methods for connecting the terminal contact points and the other parts of the device, the methods with bolts and nuts or with a clip are superior to the method employing soldering in working efficiency, but these methods comprise certain problems in obtaining sufficient reliability in the connection because of the difficulty in applying uniform contacting pressure throughout all of the contact points. Therefore, it is the usual practice in the prior art that an excessively strong pressure is applied to the connection area of the terminal contact points in order to improve the reliability in electric connection or that a cushioning material is inserted between the connection area and the means for clamping or press-contacting so that the contacting pressure is uniformly distributed over the connection area. These methods are still disadvantageous because of the insufficient reliability in connection as well as the necessity of jigs to fix the cushioning material in the predetermined positions.

SUMMARY OF THE INVENTION

It is therefore an object of the present invention to provide an electronic circuit board of the press-contact type for electronic devices with an improved structure, which is free from the above described difficulties or problems in the circuit boards of the prior art. The presscontact type circuit board of the present invention has, on a surface thereof opposite to the surface on which the terminal contact points are located, one or more protrusions formed of a rubber-like elastomer at positions in correspondence with the individual terminal contact points or with the individual groups of the terminal contact points, each of the groups being composed of a plurality of the terminal contact points aligned in a row.

DETAILED DESCRIPTION OF THE PREFERRED EMBODIMENTS

The electronic circuit boards for electronic devices in accordance with the present invention are now described in detail with reference to the drawings illustrating some preferred embodiments of the invention.

Figure 1:
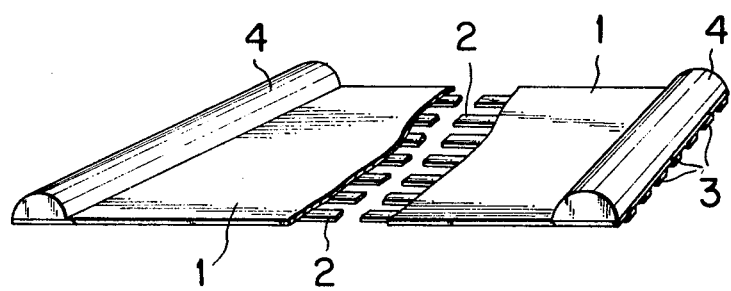
FIG. 1 to FIG. 3 are perspective views of the electronic circuit boards according to several embodiments of the present invention as viewed from; backside.

FIG. 1 illustrates a typical example of the inventive circuit board for electronic devices which includes an electrically insulating base sheet or plate 1 with flexibility. sheet 1 is provided with a printed circuit 2 on the underside surface with two groups of the terminal contact points 3, 3 located along the right and left peripheral edges over the whole length of the edges. Sheet 1 further has two protrusions or raised areas 4, 4 on the surface opposite to the terminal contact points 3, 3, each of the protrusions 4, 4 covering the area in correspondence with each of the groups of the terminal contact points 3, 3.

The material of the electrically insulating base sheet or plate 1 is not limitative insofar as it has an appropriate flexibility and is exemplified by thermoplastic resins such as polyester resins, polyimide resins and the like and synthetic rubbers such as polyisoprene rubber, butyl rubber, silicone rubber, acrylonitrile-butadiene rubber, nitrile rubber, butadiene-styrene rubber as well as acrylic ester rubber and ethylene-propylene rubber.

The protrusions 4, 4 are made of a material with rubber-like elasticity and they may be prepared in advance separately from the base sheet or plate 1 and afterwards bonded adhesively to the base sheet or plate 1 at the connection areas as shown in FIG. 1 or, alternatively, they may be shaped integrally with the base sheet or plate 1 simultaneously of the same material. The rubber-like elastic material for the protrusions has a hardness preferably in the range of Shore A 20 to 80.

The method for providing a printed circuit 2 and the terminal contact points 3, 3 on the underside surface of the base sheet or plate 1 is conventional including the methods such as bonding of a foil of metal, e.g. copper, aluminum, alloys thereof and stainless steel, adhesively to the surface of the base sheet or plate 1 followed by etching to form the desired circuit pattern, pattern-wise vacuum evaporation of a metal on to the base sheet or plate 1, adhesive bonding of a pattern-wise metal foil shaped in advance by punching, and printing with an electrically conductive rubber or paint to form the circuit pattern.

The electronic circuit boards of the present invention are employed in assembling various kinds of precision electronic devices in a very simple manner that the connection area of the circuit board is merely press-contacted onto the corresponding connection area of the other part of the device, e.g. another circuit board to be electrically connected. In this case, considerable strain or deformation can be permitted in the connection area of the circuit board since the contacting pressure can be uniformly distributed over the whole connection area owing to the elastic protrusions 4, 4 ensuring reliability in electric connection. Thus, the cushioning materials employed in the prior art circuit boards and the troubles inherent to the use of such cushioning materials are completely eliminated enabling one to easily conduct the work of assembling the electronic devices with remarkable benefits to improving productivity.

Figure 2:
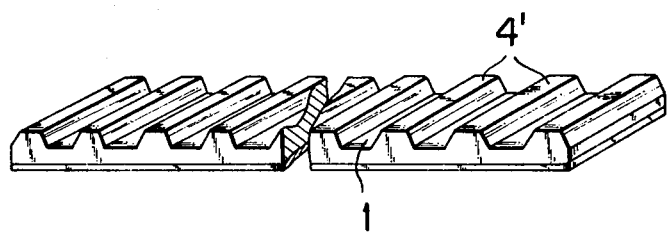
Figure 3:
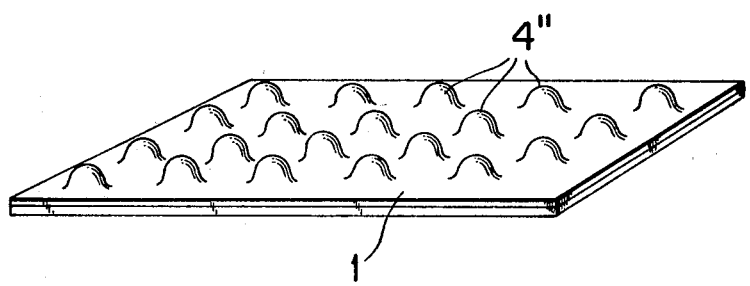

FIG. 2 and FIG. 3 show other embodiments of the electronic circuit boards in accordance with the present invention. The circuit board shown in FIG. 2 has a plurality of ribbed protrusions 4', each of which is positioned in correspondence with a row of the terminal contact points on the opposite surface of the base sheet. The circuit board shown in FIG. 3 has a plurality of isolated protrusions 4', each of which is positioned in correspondence with each of the terminal contact points provided on the underside surface of the base sheet. The circuit board shown in FIG. 2 may be employed, for example, as a flat ribbon connector with parallel circuits by press-contacting any portions of the circuit board, or it may be employed as cut sheets obtained by cutting the circuit board in a form of an endless belt to give pieces of desired lengths.

Figure 4:
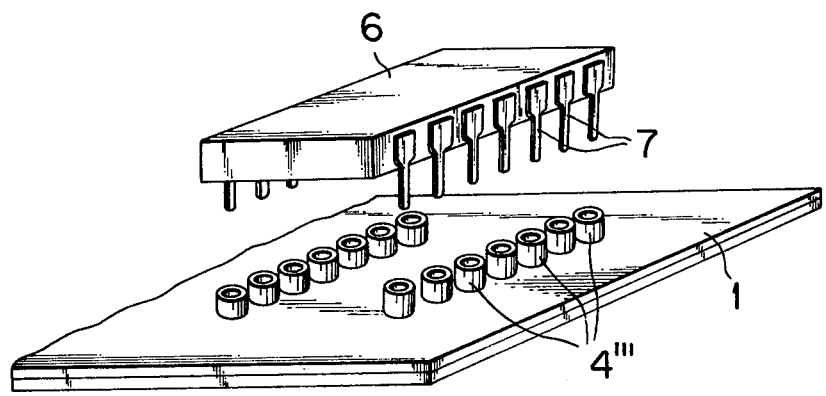
FIG. 4 is a perspective view showing the use of another embodiment of the present invention with an electronic part thereabove before it is connected to the circuit board.

The circuit board shown in FIG. 4 has two rows of ring-wise or cylindrical protrusions 4''' on the back surface of the base sheet 1 and is used by inserting the terminal legs 7 of the electronic part 6, such as a resistor and a capacitor, from the backside so that the ends of the legs 7' (FIG. 5) extend out of the front surface of the base sheet 1 where the legs 7 are bent to fix the part 6 to the base sheet 1.

Figure 5:
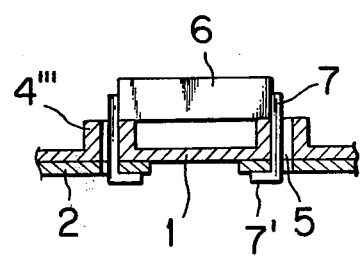
FIG. 5 is a cross sectional view of part of the assembly with the circuit board shown in FIG. 4 and an electronic part connected thereto.

FIG. 5 shows the cross section of the construction of the circuit board and the electronic part shown in FIG. 4, in which the circuit board having a printed circuit on the underside surface and provided with holes 5 at positions corresponding to the legs 7 through the base sheet 1 and the ring-wise protrusions 4''' is fastened to the integrated circuits 6 by inserting the legs 7 into the holes 5 with the ends 7' of the legs 7 bent on the underside surface of the base sheet 1. It is recommended that the insertion of the legs 7 into the holes 5 and the bending of the ends 7' of the legs 7 as shown in FIG. 5 be performed by contacting the integrated circuits 6 and the ring-wise protrusions 4''' under pressure to cause slight deformation of the elastic protrusions 4''', and the pressure is then released after completion of the bending of the legs 7 so that the resilience of the elastic protrusions 4''' makes sure the press-contacting of the leg ends 7' onto the printed circuit on the underside surace of the circuit board with good and reliable electric connection. The leg ends 7' bent on the printed circuit may, if desired, be bonded to the terminal contact points by soldering or with an electrically conductive adhesive, and the contact areas may be protected from air or moisture by coating with an electrically insulating material.

The embodiments of the present invention are not limited to those described with reference to the figures but various modifications are possible within the scope of the present invention. For example, the ribbed protrusions 4 in FIG. 1 have not necessarily uniform height over the length of the protrusion but their height may be smaller at the center and larger and in both sides of the center. Alternatively, uniformity of the contacting pressure is obtained when the height of the ribbed protrusion is larger at the center and smaller in both sides of the center.

As is described above in detail, the electronic circuit boards of the present invention can be employed in assembling various kinds of precision electronic devices by merely press-contacting the contact areas onto the other electronic parts to be electrically connected with a suitable fastening or press-contacting means exempting the use of any cushioning materials separately prepared as necessitated in assembling with the prior art electronic circuit boards. In the circuit boards of the present invention, uniform and good electric connection can be ensured throughout the contact areas of the circuit board even with smaller contacting pressure so that the restrictions in the manufacture of the prior art circuit boards are to a large extent eliminated and the freedom in the design of electronic devices assembled with the electronic circuit boards is increased to a great practical advantage.

What is claimed is:

1. An electronic circuit board comprising an insulating sheet-like base having flexibility, a printed circuit including at least one terminal contact point on one of its surfaces and an elastomer pad secured to the other surface of said base, said pad including a plurality of protrusions made of an elastic material and affixed to said base at areas in correspondence with said terminal contact point, each of said protrusions being in the form of a ring, said base being provided with a corresponding plurality of holes at positions corresponding to the void cores of said plurality of ring-shaped protrusions.

* * * * *